United States Patent [19]

Koshak

[11] Patent Number: 5,506,693
[45] Date of Patent: Apr. 9, 1996

[54] ADDRESSING MECHANISM FOR INTERFACING SPATIALLY DEFINED IMAGERY DATA WITH SEQUENTIAL MEMORY

[75] Inventor: Richard D. Koshak, Melbourne, Fla.

[73] Assignee: Harris Corporation, Melbourne, Fla.

[21] Appl. No.: 954,577

[22] Filed: Sep. 30, 1992

[51] Int. Cl.⁶ .............................. H04N 7/01; G06F 12/00
[52] U.S. Cl. ..................... 358/444; 358/500; 395/163; 395/164; 348/458
[58] Field of Search .................................. 358/448, 298, 358/466, 456, 457, 460, 465, 463, 533, 454, 536, 444; 395/119, 425, 164, 163, 157, 158, 128, 166, 162, 138; 382/50, 21, 34; 345/151, 136, 155, 133, 185, 196, 107, 149, 200, 187, 136, 28, 135

[56] References Cited

U.S. PATENT DOCUMENTS

| | | | |
|---|---|---|---|
| 4,232,376 | 11/1980 | Dion et al. | 365/222 |
| 4,350,996 | 9/1982 | Rosenfeld | 358/75 |
| 4,456,924 | 6/1984 | Rosenfeld | 358/75 |
| 4,642,625 | 2/1987 | Tsunehiro et al. | 340/747 |
| 4,646,262 | 2/1987 | Smith | 364/900 |
| 4,652,760 | 3/1987 | Kondo et al. | 250/363 |
| 4,653,013 | 3/1987 | Collins et al. | 364/518 |
| 4,808,986 | 2/1989 | Mansfield et al. | 340/747 |
| 4,864,629 | 9/1989 | Deering | 382/34 |
| 4,866,520 | 9/1989 | Nomura et al. | 358/140 |
| 4,903,217 | 2/1990 | Gupta et al. | 364/521 |
| 5,113,505 | 5/1992 | Holtz | 395/400 |
| 5,230,064 | 7/1993 | Kuo et al. | 395/162 |
| 5,251,296 | 10/1993 | Rhoden et al. | 395/164 |
| 5,283,863 | 2/1994 | Guttag et al. | 395/157 |
| 5,300,947 | 4/1994 | Katsura et al. | 345/155 |
| 5,315,700 | 5/1994 | Johnston et al. | 395/163 |

*Primary Examiner*—Paul Ip
*Attorney, Agent, or Firm*—Charles E. Wands

[57] ABSTRACT

An imagery data memory addressing mechanism writes data representative of respective pixel values of an image into and reads out of immediately successive storage locations of memory, irrespective of whether the number of pixels in the image is the same as or less than the number of storage locations of memory, facilitating the use of a DMA controller and reducing access time. Data values associated with successive pixels of a first line of the m lines of the m×n image are stored in successive first through n storage locations of the framestore memory and data values associated with successive pixels of successive ones of second through m lines of the image are stored in successive (n+1) through mn storage locations of the framestore, so that there are no unused or dummy memory locations (in which 'fill' data is inserted) between those memory addresses associated with the first line and the last or mth line of the image. Once the framestore has been loaded with pixel data of the image of interest, all or a selected portion of the image may be accessed and coupled to an output device the spatial resolution of which may differ from that of the stored image. Also, the coordinates of the pixels of the selected portion of the output image array need not necessarily coincide with spatial locations of the pixels of the stored image. To read data out of the framestore, pixel code values stored in respective pluralities of memory storage locations associated with respective neighborhoods of pixels surrounding respective ones of pseudo pixels of the output image are weighted and combined.

24 Claims, 6 Drawing Sheets

○ ORIGINAL KERNEL POINTS
● INTERPOLATED KERNEL POINTS: SHIFT 1
■ INTERPOLATED KERNEL POINTS: SHIFT 2
▲ INTERPOLATED KERNEL POINTS: SHIFT 3

ADDRESSING MECHANISM FOR INTERFACING SPATIALLY DEFINED IMAGERY DATA WITH SEQUENTIAL MEMORY

FIELD OF THE INVENTION

The present invention relates in general to imagery data processing systems and is particularly directed to a memory addressing mechanism through which imagery data associated with respective pixels of a two-dimensional spatial image array are written into and read out of successive storage locations of an digital image framestore, without wasting memory, for example by skipping unused memory locations, or employing dummy memory locations into which 'fill' data may be loaded to effect a spatial mapping between memory space and pixels of the image array.

BACKGROUND OF THE INVENTION

Recent improvements in their spatial and data resolution capabilities have made digital image processing systems attractive for a variety of image-processing (e.g. recording and reproduction) applications. In still image photography, for example, when an image (such as that captured on photographic film or by a high resolution digital camera) has been digitized and stored in an attendant digital data base or framestore, it is readily optimized for reproduction by means of image processing software and a variety of reproduction devices having differing spatial resolutions.

Figure 1:
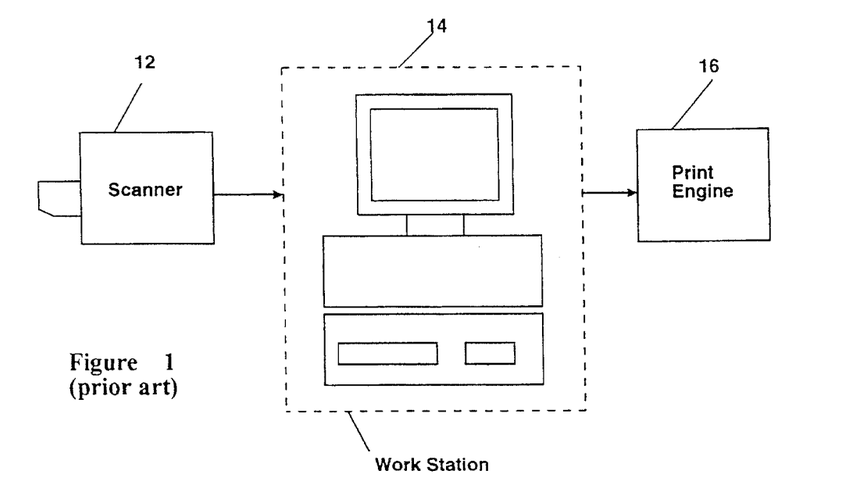
FIG. 1 diagrammatically illustrates an image processing system employing a high resolution opto-electronic scanner, the output of which is coupled to a host digitized image processor.

Such a digital image processing system is diagrammatically illustrated in FIG. 1 as comprising a digital image data source, such as a high resolution opto-electronic scanner 12, the output of which is coupled to a host digitized image processor (host computer) 14. In the exemplary system depicted in FIG. 1, scanner 12 may contain a very high resolution sensor pixel array (e.g. a 4096×3072 pixel matrix) capable of generating high spatial density-representative output signals which, when converted into digital format, yield 'digitized' image files, from which high quality hard copy prints, such as those provided by a laser printer, may be obtained. Namely, the imagery data source (here scanner 12) outputs digitally encoded imagery data, or a 'digitized' image. This digital image is supplied in the form of an imaging pixel array-representative bit map, resolved to a prescribed code width (e.g. twelve bits per pixel), to a host processor 14. Host processor 14 typically contains an image encoding and storage operator through which the digitized image file is stored in an attendant memory (framestore). Once stored in memory the digital image may be controllably modified or edited by resident image processing software, so that it may be appropriately formatted for reproduction by one or more devices the resolution of which may vary from device to device, such as a low/moderate NTSC television monitor or a very high resolution, digitally driven, thermal (laser) printer 16.

For optimum performance, it is necessary that the storage capacity of the framestore be at least as large as the spatial resolution of the highest resolution image to be processed. For example, if the highest resolution image capable of being accommodated is a 4096×3072 pixel array, the framestore may have a storage capacity on the order of twelve million addresses, corresponding to an address code resolution on the order of twenty four bits. To accommodate a highest resolution image, it has been customary practice to employ an addressing mechanism which preallocates framestore memory in segments of memory space on the basis of the (largest expected) number of pixels per line of such an image. Also, the dimensions of the image are allocated memory in powers of two of the number of pixels per line and lines per image array. Such a memory address preallocation scheme is diagrammatically illustrated in a simplified manner in FIG. 2.

Figure 2:
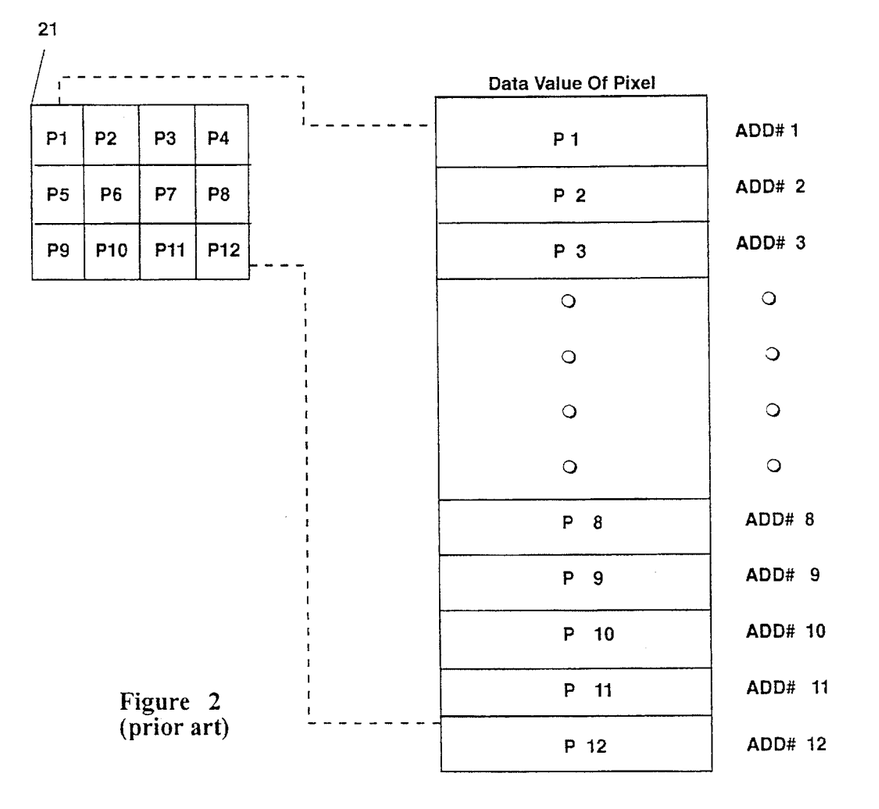
FIG. 2 diagrammatically illustrates a memory address preallocation scheme in which a 4×3 pixel array is mapped into a framestore the storage capacity of which is twelve memory cells.

More particularly, FIG. 2 shows a 4×3 pixel array 21 and a framestore 23, the storage capacity of which is twelve memory cells having respective addresses ADD#1–ADD#12. In the simplified example of FIG. 2, memory is preallocated in segments of four cells or memory addresses per line of pixels of the image, with memory addresses ADD#1–ADD#4 being preallocated to store the first line (pixels P1–P4), memory addresses ADD#5–ADD#8 preallocated to store the second line (pixels P5–P8), and memory addresses ADD#9–ADD#12 preallocated to store the third line (pixels P9–P12). Dotted lines are shown connecting respective pixel locations 1–12 of 4×3 pixel array 21 and respective memory addresses ADD#1–ADD#12 of memory 23, to illustrate the manner in which the pixel locations of the image matrix or array are assigned or preallocated to the memory. When the image is to be read out, the memory is scanned sequentially beginning with address ADD#1 and continuing though address ADD#12, so as to output the three lines of (four pixels per line of) the stored image.

To accommodate the not-infrequent case where the input image has a spatial resolution less than the capacity of the framestore, the conventional preallocation addressing scheme illustrated in FIG. 2 may employ a memory management scheme through which unused portions of memory or skipped, or it may cause unused portions of each memory segment to be filled or 'stuffed' with prescribed data values, for example zeros. The effect of employing dummy fill data in association with the preallocation scheme of FIG. 2 on such a reduced spatial resolution image is diagrammatically illustrated in FIG. 3, which shows the manner in which a 3×2 pixel array 31 is mapped into framestore 23. For the reduced spatial resolution of 3×2 pixel array 31, since memory 23 is preallocated in four cell segments (i.e. four pixels per line segments), memory addresses ADD#1–ADD#3 will store the first line (pixels P1–P3) of the 3×2 image, but no imagery data is available for memory address ADD#4. In this case memory address ADD#4 is, in effect, a dummy memory cell, in which a prescribed data value (e.g. 0) may be written. For the next or second line of pixel data memory addresses ADD#5–ADD#7 store the data values of the second and last line of the image (pixels P4–P6) and memory address ADD#8 stores a zero, as do the remaining memory addresses ADD#9– ADD#12.

Figure 3:
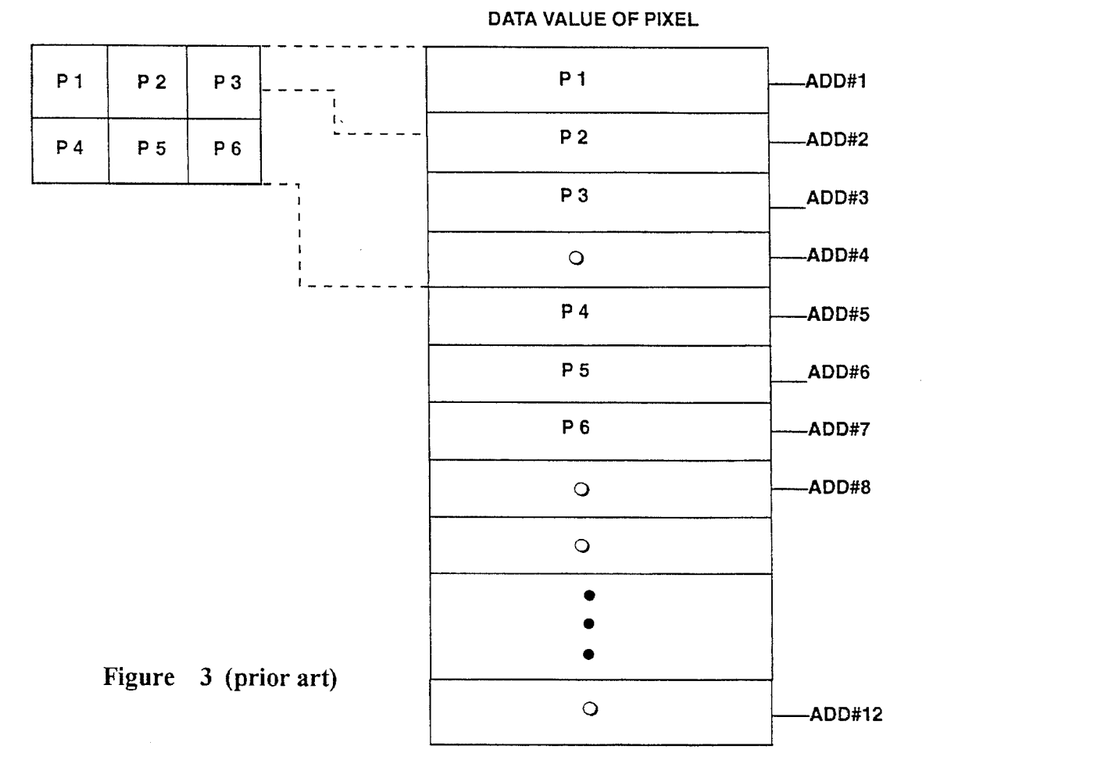
FIG. 3 shows the manner in which a 3×2 pixel array is mapped into a twelve address framestore.

In will be appreciated that a preallocation scheme of the type diagrammatically illustrated in FIGS. 2 and 3 effectively performs a spatial mapping of an input image into the framestore such that the addressing mechanism accesses the entire memory. Not only does such an addressing scheme require additional processing complexity during the write cycle, but it is necessary to employ a mapping management tool to delete unwanted fill data on read-out. It can be seen therefore that this conventional technique of digital image storage suffers from increased hardware requirements, processing complexity and access time.

SUMMARY OF THE INVENTION

In accordance with the present invention, drawbacks such as bit 'stuffing' and memory management schemes required by conventional address preallocation image mapping systems are effectively obviated by an image data interfacing mechanism through which imagery data associated with respective pixels of a two-dimensional spatial image array are written into and read out of consecutively contiguous storage locations of memory, thereby obviating the need for dummy memory locations in which 'fill' data would otherwise be inserted to effect a spatial mapping of memory space to the pixels of the image array.

More particularly, pursuant to the memory addressing mechanism of the present invention, data representative of respective pixel values of an image are written into and read out of immediately successive storage locations of memory, irrespective of whether the number of pixels in the image is the same as or less than the number of storage locations of memory, so as to facilitate the use of a direct memory access (DMA) controller and thereby reduce access time. For purposes of image definition, any digital image may be considered to comprise m successive lines of pixels, each line having n pixels, so that the overall image comprises an array of m×n pixels.

The memory addressing mechanism of the present invention involves writing data values associated with successive pixels of a first line of the m lines of the m×n image into successive first through n storage locations of the framestore memory and writing data values associated with successive pixels of successive ones of second through m lines of the image into successive (n+1) through mn storage locations of the framestore, so that there are no unused or dummy memory locations (in which 'fill' data is inserted) between those memory addresses associated with the first line and the last or mth line of the image. Namely, the entirety of the image is written into successively contiguous locations of the memory space. Once the framestore has been loaded with pixel data of the image of interest, all or a selected portion of the image may be accessed and coupled to an output device the spatial resolution of which may differ from that of the stored image. Also, the coordinates of the pixels of the selected portion of the output image array need not necessarily coincide with spatial locations of the pixels of the stored (input) image.

To read data out of the successively contiguous storage locations of the framestore, the addressing mechanism of the invention operates so as to access pixel code values stored in respective pluralities of memory storage locations associated with respective pluralities or neighborhoods of pixels surrounding respective ones of the spatial locations (or pseudo pixels) of the output image. Each respective neighborhood of pixel values is then processed (weighted and combined) to generate an interpolated estimate of the pixel code for a respective pseudo pixel of interest.

Within a first of the neighborhoods of the pixels of the input (stored) image that surround selected spatial locations or pseudo pixels of the output image, a first pixel is identified and the contents of the storage location associated with that first pixel are read out. The memory address for this first pixel value is defined by a combination of a first address code representative of where, within the line of pixels containing the first pixel, the first pixel is located, and a second address code representative of the product of the number of pixels per line and a value representative of the line of pixels. To generate memory addresses for the remaining pixels of the neighborhood, this first memory address is successively modified in an incremental manner by a prescribed value, so as to sequentially step through each of the remaining pixels of the first neighborhood of pixels surrounding the pseudo pixel. As noted above, the pixel values of the first neighborhood are then weighted and summed, so as to derive a resultant interpolated pixel data value for the first pseudo pixel of the output image.

After the first neighborhood has been processed to derive a first interpolated pixel output value for the first pseudo pixel of the output image, the original address value of the first pixel in the first neighborhood of the stored image is incremented by a value based upon the resolution of the output image along a first coordinate direction (e.g. horizontal or x-direction) of the stored image. This incrementing step locates a first pixel in a neighborhood of pixels surrounding the next successive pseudo pixel within the first line of the output image. Namely, for obtaining output pixel values associated with each of the remaining pseudo pixels of the output image, it is only necessary to successively increment the memory address of the first pixel of the first neighborhood and then repeat the sequential scanning process across the first line of the output image. At the completion of processing of the first line of the output image, the first pixel address of the first neighborhood surrounding the first pseudo pixel is incremented by a value corresponding to the number of pixels per line of the stored image and the process is repeated for the second line of the output image. This successive incrementing of the first neighborhood's first pixel address, in association with successive pixel neighborhoods surrounding the remaining pseudo pixels of the output image, is continued through the last line of the output image, thereby providing successive interpolated pixel data values corresponding to all of the (pseudo) pixel locations of the output image array.

Advantageously, the inventive addressing mechanism for accessing the stored pixel codes of respective neighborhoods of pixels of the stored image is relatively simple and straightforward, essentially involving a series of arithmetic modifications of the address of an initially identified pixel of the neighborhood surrounding the first pseudo pixel. As a consequence, the above described deficiencies of conventional bit 'stuffing' and memory management schemes employed in address preallocation image mapping systems are unnecessary, thus reducing memory requirements and cost.

DETAILED DESCRIPTION

Before describing in detail the particular improved memory addressing mechanism in accordance with the present invention, it should be observed that the invention resides primarily in a novel structural combination of conventional signal processing circuits and components and an augmentation of the address generation mechanism employed by the image processing system, so as to enable digitized imagery data to be readily loaded into and read out from successive storage locations of memory, without the need to employ memory management software to skip unused memory or to 'fill' unused memory locations with 'dummy' data values. Accordingly, the structure, control and arrangement of these conventional circuits and components have been illustrated in the drawings by readily understandable block diagrams which show only those specific details that are pertinent to the present invention, so as not to obscure the disclosure with structural details which will be readily apparent to those skilled in the art having the benefit of the description herein. Thus, the block diagram illustrations of the Figures do not necessarily represent the mechanical structural arrangement of the exemplary system, but are primarily intended to illustrate the major structural components of the system in a convenient functional grouping, whereby the present invention may be more readily understood.

Figure 4:
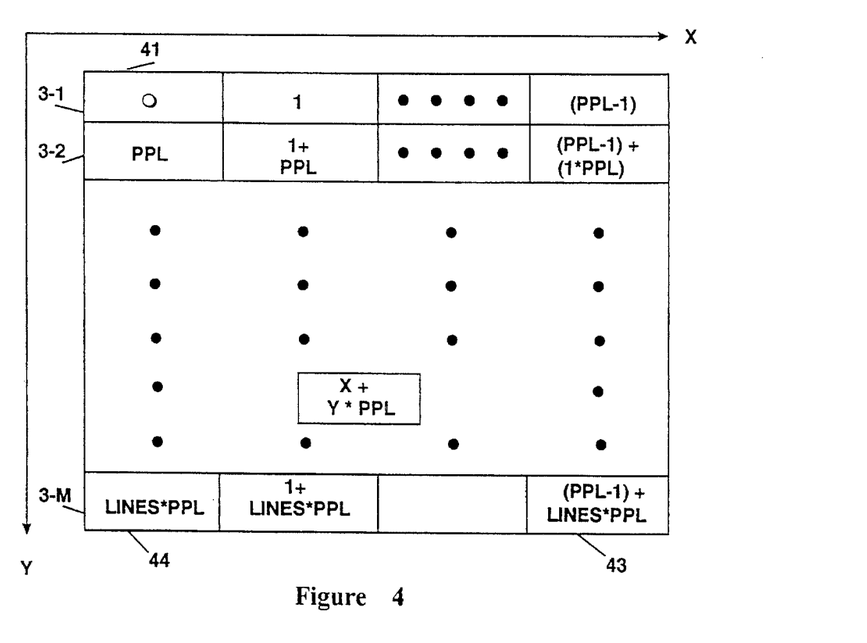
FIG. 4 shows the association between the pixels of a two dimensional image array and a linear sequence of address codes.
Figure 5:
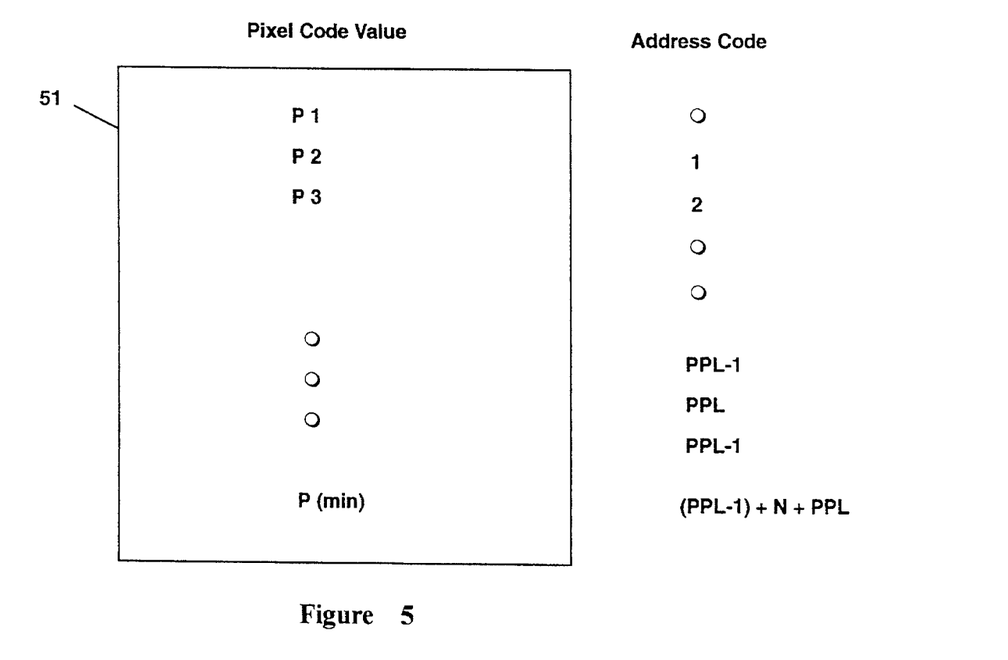
FIG. 5 shows a rearrangement of the address codes of FIG. 4, spatially associated with the pixels of an image array, as a linear sequence of contiguous memory cells of a framestore memory.

FIGS. 4 and 5 diagrammatically illustrate the manner in which the memory addressing mechanism of the present invention maps or writes data values associated with respective pixels of successive lines of an image into successive first through m×n storage locations of a linearly addressable framestore or digital image memory. Specifically, FIG. 4 shows the association between the pixels of a two dimensional image array and a linear sequence of address codes, beginning with an address code 41 (the address code value of which is zero (0)) and terminating at an address code 43 (the address code value of which is equal to the product of the number of lines (m) of the image and the number of pixels per line (n) plus the number of pixels per line less one (n−1)). The addresses are spatially arranged in FIG. 4 in correspondence with respective pixels of an input image derived from an opto-electronic imaging source, such as the sensor 12 of the system of FIG. 1, described above. FIG. 5 shows a rearrangement of the address codes of FIG. 4 (as spatially associated with the pixels of the image array) as a linear sequence of contiguous memory cells of a framestore memory space 51.

It will be realized that, in actuality, the respective memory cells of the framestore memory space to be addressed by the sequence of address code values shown in FIG. 4 are not necessarily, and would not normally be, spatially arranged in the same manner as the image pixel array. The spatial layout of the memory itself is not material to the present invention. What is important, however, is the fact that the storage locations of the framestore are sequentially addressable, so that as successive pixel data values are obtained from successively adjacent pixels in successive lines of the image, they are written into successive ones of addressable memory locations of the framestore.

The FIG. 4 and FIG. 5 illustrations of the association of pixels of the array with framestore memory addresses show a first line 3-1 of address codes, line 3-1 beginning with first memory address code (zero) 41 and ending with address code 42 associated with the number (n) of pixels per line (PPL) less one, and additional lines 3-2 . . . 3-m lines of address codes. Line 3-m begins with an address code 44, the value of which is equal to the product of the number of lines (m) and the number of pixels per line (PPL) or mPPL, and terminates with address code 43, the value of which is equal to the sum of the product of the number of lines (m) and the number of pixels per line (PPL) plus the number of pixels per line less one (PPL−1).

Namely, unlike the conventional preallocation addressing scheme of FIGS. 2 and 3, described above, in which the values of the address codes are prespecified on the basis of a prescribed maximum line width (number of pixels per line) of an image capable of being stored in the framestore, the memory addressing mechanism of the present invention defines the values of the address codes in sequential order pixel-by-pixel, line-by-line, of the image. As a consequence, regardless of the size (spatial resolution) of the image, the memory space 51 into which its pixel code values are written will contain no gaps or 'dummy' cells between successive pixel data entries, so that the memory space 51 may be accessed without the need for a management scheme to handle auxiliary fill data between actual imagery data.

Once the framestore 51 has been loaded with pixel data of the input image of interest, all or a selected portion of the stored input image may be accessed to define an output image which is coupled to an output device the spatial resolution of which may differ from that of the stored input image. Also, the coordinates of the selected portion of the output image need not necessarily and typically will not coincide with spatial locations of the pixels of the stored input image.

Figure 6:
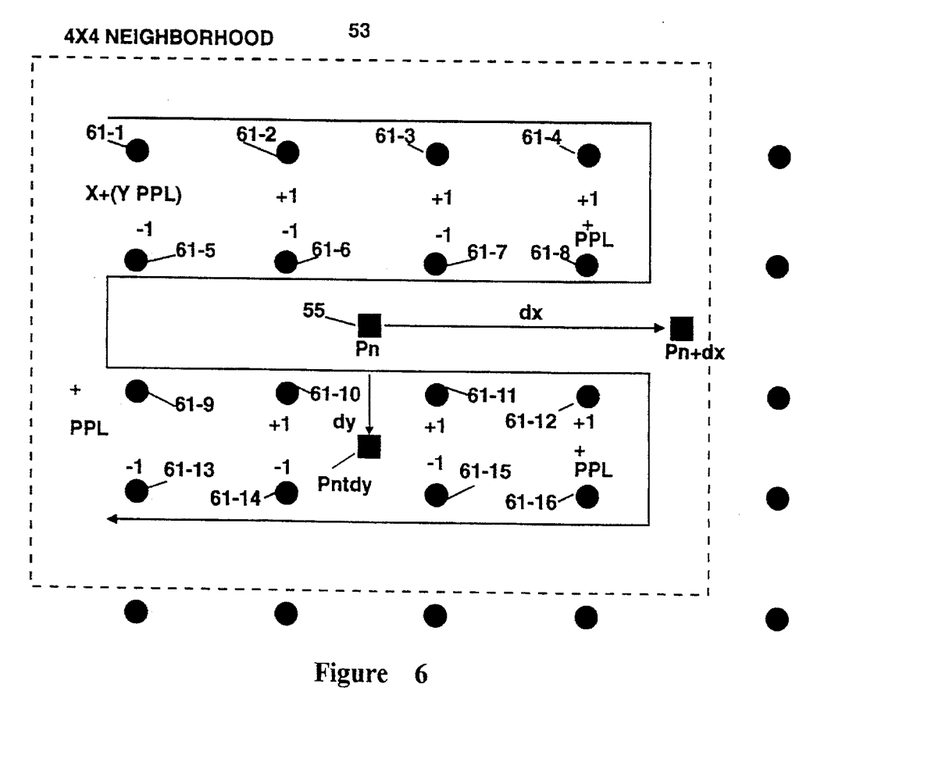
FIG. 6 diagrammatically illustrates a neighborhood of sixteen pixels surrounding a selected pseudo pixel Pn within a stored image array for which an output pixel code is to be produced.

More particularly, as described briefly above, the addressing mechanism of the invention operates so as to access input pixel code values stored in respective pluralities of memory locations associated with respective pluralities or neighborhoods of pixels that surround respective ones of the spatial locations or pseudo pixels of which the output image array is to be formed. FIG. 6 diagrammatically illustrates a neighborhood 53 of (sixteen) pixels (61-1 . . . 61-16) surrounding a selected output image spatial location 55 or pseudo pixel Pn that lies within the stored input image array for which an output pixel code value or estimate is to be produced, based upon a weighted combination of the values of the surrounding neighborhood of sixteen. The term pseudo pixel Pn is employed to denote a spatial location that identifies where, in the input pixel array, a respective output pixel occurs; the actual location of the selected spatial location 55 need not coincide with any pixel location of the original image, so that location 55 of an output pixel of the output image array is effectively a "pseudo" pixel in the input image array.

It should also be observed that, although, in the example shown, a neighborhood 53 comprises sixteen pixels 61-1 . . . 61-16, the invention is not limited to this or any particular number. The number chosen here is consistent with standard statistical sampling techniques when providing interpolated estimates based upon a spatial data set, with the neighborhood from which the interpolation estimate is derived being distributed about or effectively 'surrounding' the pseudo pixel of interest, such that pseudo pixel Pn lies within an interior set of four pixels 61-6, 61-7, 61-10, 61-11, so that the neighborhood 53 possesses some degree of symmetry or balance about the pseudo pixel and contains a statistically adequate number from which a relatively precise value of an output pixel may be derived.

Typically, an output image for which pseudo pixel code values are to be derived may occupy some portion of the original image and may have any desired resolution that may be accommodated by the data resolution used to define the spatial resolution of the original image. In the example shown in FIG. 6, the differential spacing in the x direction between adjacent pseudo pixels (e.g. Pn and Pn+dx) of the output image is delineated as a spacing 'dx'. Similarly, the differential spacing in the y direction between adjacent pseudo pixels (e.g. Pn and Pn+dy) is delineated as a spacing 'dy'. From a comparison of the differential spacings between adjacent pseudo pixels of the output image with the differential spacings between the pixels of the original image array of FIG. 6, it can be seen that the pseudo pixel differential spacing of the output image are greater than the relative spacings of the pixels of the original image, so that the spatial resolution of the output image of the illustrated example is lower than that of the original image.

The code width through which the spatial separation of the input pixels of the original image is specified may include some prescribed number of fractional bits (e.g. four bits—corresponding to sixteen subdivisions in each of the x and y directions between pixels of the original image array, for a total of eight fractional bits per pseudo pixel location). Thus, the fractional (x and y) coordinates of the location of a respective pseudo pixel within a quadrant 63 formed by the set of four pixels 61-6, 61-7, 61-10, 61-11 of the original image will be one of 256 values. These eight fractional bits are employed to address one of a set ($2^8$=256 in the present example) of weighting coefficient look-up tables that contain respective sets of sixteen weighting coefficients each. These (256) sets of weighting coefficients are scaled relative to one another based upon the relative differences in geometrical locations of the fractional coordinates, namely in accordance with where each of the possible 256 fractional coordinate sets is spatially located with respect to its surrounding neighborhood of sixteen input pixels. Which of the sixteen weighting coefficients of a look-up table that has been addressed by the eight fractional bits is accessed is defined by the four bits that identify one of the input pixels in the neighborhood of sixteen surrounding the pseudo pixel.

For purposes of providing a non-limitative example, the weighting coefficients may be defined in accordance with an edge sharpening filtering mechanism to be described below with reference to FIGS. 10, 11 and 12. It should be realized, however, that the coefficient function given here is merely provided for purposes of example; other weighting/interpolation operators customarily employed in digital image processing may also be suitable depending upon the data set and image characteristics.

As described above, in order to generate the pixel code value for each pseudo pixel Pn of the output image, the pixel code values of an associated (surrounding) neighborhood 53 of pixel values are processed (weighted and combined) to derive an interpolated estimate. Pursuant to the present invention, for a given output image array, which may occupy the entirety or less than the entirety of the pixels of the stored image array, the pseudo pixel code value derivation process begins with the identification of a selected pixel within the stored array from which it is possible to step though or sequentially access code values of a neighborhood of pixels surrounding a first pseudo pixel of the output array, shown in FIG. 6 as pseudo pixel Pn.

Using a north-up convention for purposes of spatial coordinate identification in the illustrated example, then within the neighborhood 53 of sixteen pixels 61-1 . . . 61-16 surrounding pseudo pixel Pn, the northwestmost pixel 61-1 is identified as the first pixel from which the interpolation sequence begins. Since the original image is written into the framestore using an addressing scheme based upon the number of number of pixels per line and the number of lines of the image, the actual address of the stored code value of the first pixel 61-1 of neighborhood 53 is equal to the sum of the column or x address of pixel 61 and the product of the line in which pixel 61-1 is located and the number of pixels per line, as described above with reference to FIGS. 4 and 5. This initial address (x+yPPL) of pixel 61-1 is used as a base reference upon which addressing of each neighborhood surrounding each pseudo pixel of the output image is executed.

Figure 7:
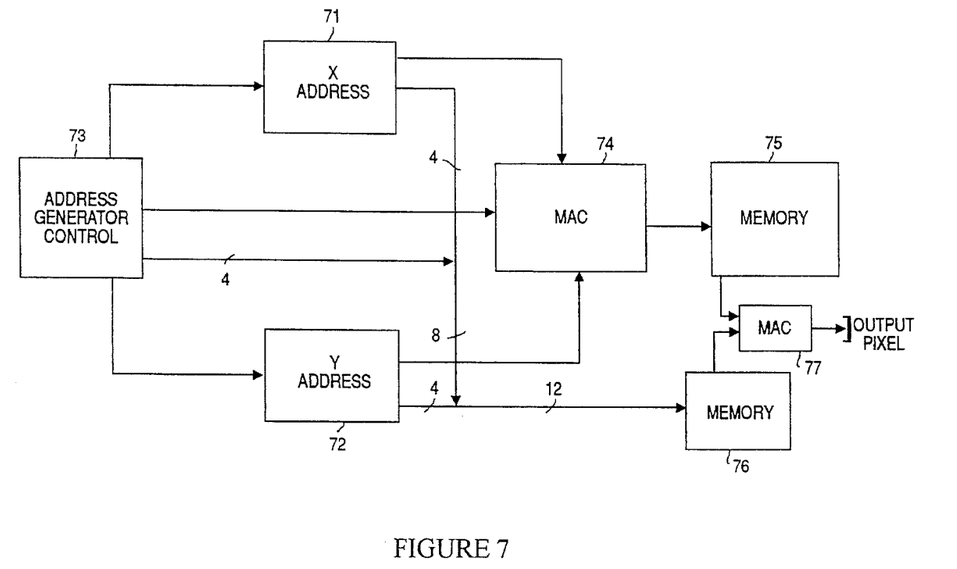
FIG. 7 diagrammatically illustrates an address generator for generating x and y address codes for framestore and coefficient memory access.
Figure 8:
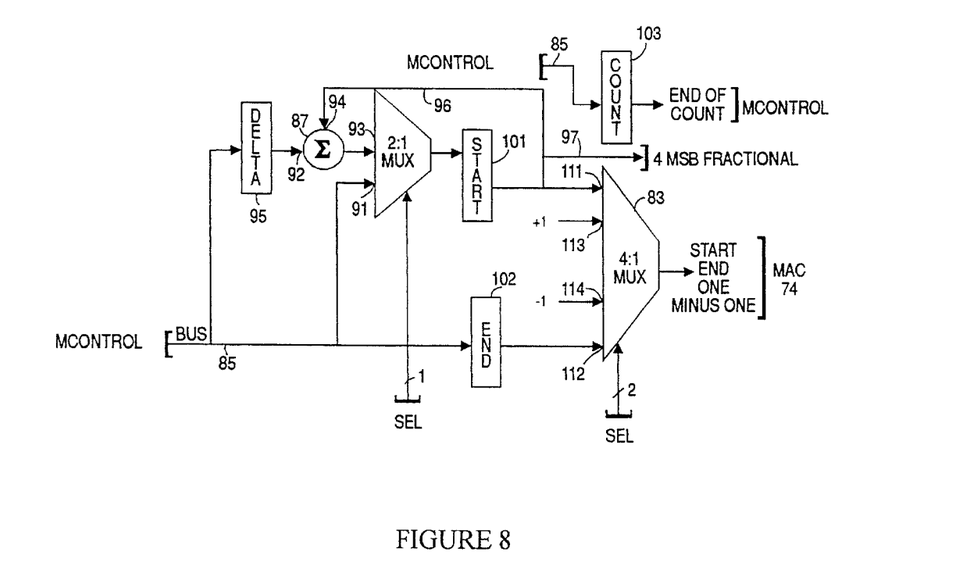
FIG. 8 shows the configuration of a respective x or y address generator employed in the address generator of FIG. 7.

For this purpose, an address generator diagrammatically illustrated in FIG. 7 comprises respective x and y address code generators 71, 72, each of which has the configuration shown in FIG. 8. Each of the x and y address generators 71 and 72 is controlled by address sequencing hardware within an attendant state machine, shown in FIG. 7 as an address generator control unit 73. The address sequencing operation carried out by address generator control unit 73 will be described in detail below with reference to FIGS. 6 and 8. The x and y components of the address code values generated by x and y address generators 71 and 72 are combined in a multiply-accumulator unit 74, which outputs the actual address to be supplied to the framestore 75 for extracting a stored pixel code value to be employed in the production of a neighborhood interpolation estimate. The x and y address components are also coupled to a weighting coefficient memory 76 from which a weighting coefficient operator used to interpolate the value of a respective pixel data value is obtained. The accessed pixel code and weighting coefficient values are coupled to a multiply-accumulator 77, from which the interpolated estimate for a respective neighborhood of sixteen stored pixels surrounding the pseudo pixel of interest is derived.

As shown in FIG. 8, a respective x-address generator 71 or y-address generator 72 comprises an input (2:1) multiplexer 81 and an output (4:1) multiplexer 83. Input multiplexer 81 has a first input 91 coupled to input bus 85 from address generator control unit 73, and a second input 93 coupled to the output of an adder 87. In the present example, input bus 85 is twenty-four bits wide, having twelve bits for defining the integer component of a pixel address and twelve bits for its fractional component. Adder 87 has a first input 92 coupled to receive the contents of a difference or 'd' register 95 the input of which is coupled to input bus 85.

The difference value 'd' stored in register 95 in the x address generator 71 is defined in accordance with a first prescribed relationship between the number (n) of pixels per line of the input image array and the number (j) of pixels per line of the output image array. The difference value 'd' stored in register 95 in the y address generator 72 is defined in accordance with a second prescribed relationship between the (m) lines of pixels of the input image array and the (k) lines of pixels of the output image array. These first and second prescribed relationships are such that each neighborhood of input pixels code values employed to derive an output pixel code value has the same spatial size and is associated with only input pixels of the input image array, so that no additional (non-image) pixels are required to complete neighborhoods of pixels to compensate for edge effects that would be present if the output image array were allowed to overlap the spatial extremities of the input image.

The first prescribed relationship establishes the separation 'dx' between adjacent pixels of a respective one of the j lines of pixels of the output image array, in accordance with the ratio of the difference between the n pixels per line of the input image array minus a first predetermined number of pixels and the j pixels per line of the output image array. The second prescribed relationship establishes the separation 'dy' between adjacent lines of the output image array in accordance with the ratio of the difference between the m lines of the input image array minus a second predetermined number and the k lines of the output image array. The first and second predetermined numbers are dependent upon the size of a neighborhood of pixels from which the pixel code value of a pseudo pixel is estimated.

More specifically, because neighborhoods of pixels are used to generate estimates of pseudo pixels, then, regardless of the spatial location of a pseudo pixel, it will always be necessary to define some neighborhood of pixels surrounding the pseudo pixel of interest. In order to ensure that every neighborhood contains only pixels of the original image, the size (number of pixels in each of the x and y directions) of the neighborhood selected to generate a respective estimate will delimit how close to an edge of the original image array a pseudo pixel may be located. In particular, how close to the edge of the original input image array a pseudo pixel can be located, for a specified (e.g. x) direction of the output image array, and therefore the differential spacing (e.g. 'dx') between pseudo pixels, will depend upon the number of pixels in that specified direction of the input image array minus the number of pixels in that direction of the neighborhood, less one pixel (to account for the pseudo pixel).

Figure 9:
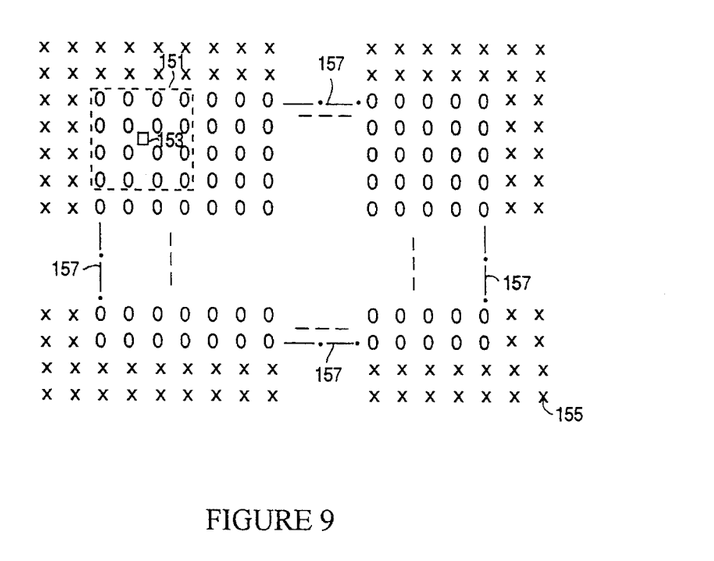
FIG. 9 diagrammatically illustrates the differential spacing limitation in the input pixel array for a four-by-four pixel neighborhood surrounding a pseudo pixel.

This differential spacing limitation is diagrammatically illustrated in the pixel array of FIG. 9 for the present example of a four-by-four pixel neighborhood 151 surrounding a pseudo pixel 153 (having four pixels in the x direction and four pixels in the y direction). Since neighborhood 151 contains three additional pixels in each of the x and y directions, it is necessary to subtract three pixels from the number of pixels per line (in the x direction) and the number of lines (in the y direction) of the input image, in order to ensure that each neighborhood of sixteen will contain only pixels of the input image array. By conforming with this requirement, no additional (non-image) pixel values (as shown by X's 155) will be required to complete neighborhoods of pixels to compensate for edge effects that would be present if the output image array were allowed to overlap the spatial extremities 157 of the input image array.

It will be readily understood that as the size of the neighborhood varies, the spacing differential will also change. For example, if the size of the neighborhood were increased to a five-by-five array, then it would be necessary to subtract four pixels from each of the number of pixels per line and the number of lines in the original image to determine the maximum permissible pseudo pixel differential spacing. The actual value of the output image resolution in a given direction is equal to the ratio of the difference between the number of pixels of the input image, minus the neighborhood offset, divided by the number of pseudo pixels in the output image.

Adder 87 has a second input 94 coupled via link 96 to the output of a START register 101. The contents of START register 101 are also coupled via link 96 to a first input 111 of 4:1 output multiplexer 83. START register 101 is used to store the address of a respective pixel in the output image, and is initially loaded with an address code associated with the northwestmost pseudo pixel of the output image (address x=0, y=0), which points to the northwestmost pixel in the input image, and thereby the first pixel 61-1 in the first neighborhood 53 of sixteen pixels surrounding the first output pixel or pseudo pixel in the first line of the output image. The four most significant bits of the (twelve bit) fractional address component stored in START register 101 are coupled over link 97 to weighting coefficient memory 76 (FIG. 7).

Input bus 85 is further coupled to an END register 102, the output of which is coupled to a second input 112 of 4:1 output multiplexer 83, and to a down counter 103. Third and fourth inputs 113, 114 of output multiplexer 83 are coupled to receive digital codes corresponding to positive and negative unit values +1 and −1, respectively. The output of 4:1 output multiplexer 83 is coupled to multiply/accumulator 74.

The output of down counter 103 is coupled via line 107 to address generator control unit 73 to indicate, upon reaching its terminal count or rolling over to zero, when the end of a line of pseudo pixels (in the case of the x address generator 71) or the number of lines of the output image (in the case of y address generator 72) has been reached. END register 102 stores either the number n of input pixels per line (PPL) of the input image (in the case of x address generator 71) or the number m of lines of the input image (in the case of y address generator 72).

OPERATION

The manner in which the address generator of FIGS. 7 and 8 operates to generate successive addresses of respective neighborhoods of (sixteen pixels in the present example) surrounding pseudo pixels Pn of a j×k output image array having, as illustrated in FIG. 6, a spatial resolution somewhat lower than that of the input image, will now be described. Initially, parameters of the input image array and the output image array are employed to preload each the registers of the x and y address generators 71, 72 (FIG. 8). In particular, via input bus 85, address generator control unit 73 initially loads the 'd' register with the differential spacing value based upon the sizes of the input and output images and the number of pixels in a neighborhood, as described above. Thus, in the present example, the 'dx" register 95 in the x address generator 71 will be loaded with the value (n−3)/j, while the 'dy" register 95 in the y address generator 72 will be loaded with the value (m−3)/k, thereby ensuring that every neighborhood of sixteen pixels will only pixels of the original image array, as described above.

END register 102 in x address generator 71 is loaded with the number of pixels per line of the input image, namely the value PPL=n, while END register 102 in y address generator 72 is loaded with the number of lines in the input image, namely the value m. Down counter 103 in x address generator 71 is loaded with the number of output (pseudo) pixels per line of the output image, or the value j, while down counter 103 in y address generator 72 is loaded with the number of lines of the output image or the value k.

Finally, START register 101 in x address generator 71 is initially loaded with the x address of the first output pixel of the output image, and START register 101 in y address generator 72 is initially loaded with the y address of the first output pixel of the output image. For the present example, where the first pseudo pixel of the output image array is its northwestmost pixel, then this first pseudo pixel has the address (x=0,y=0). Thus, START registers 101 in each of the x and y address generators 71 and 72 are initially loaded with address codes (0,0), so that each START register points to the address of the northwestmost pixel 61-1 of the input image array, which is the first pixel neighborhood 53 surrounding the first pseudo pixel Pn, as shown in FIG. 6.

As pointed out above, the contents of each of START and END registers are supplied, together with incremental unitary values (+1) and (−1) to respective inputs of 4:1 output multiplexer 83. The select inputs of output multiplexer 83 are sequentially controlled to cause output multiplexer 83 to couple one of its four inputs 111, 112, 113 and 114 as an address code component to multiply accumulator 74 (FIG. 7), so that a framestore memory address may be calculated. Since each framestore address is defined as (X+Y*PPL), then to determine the memory address for the first pixel location 61-1, output multiplexer 83 in each of the x and y address generators couples the initially stored (0) code in START register 101 to multiply accumulator 74. In actuality, multiply accumulator 74 multiplies the X code value by unity (1), so that the expression (X+Y*PPL) is implemented as a dual multiply and sum: (X*1+Y*PPL). Since each of the X and Y values is initially (0), the first address code (0*1+0*PPL) is (0), pointing to pixel 61-1. Multiply accumulator thus generates the address code (0) as the first address of the first neighborhood of sixteen from which the first pseudo pixel of the output image is to be estimated. The actual pixel code value associated with input pixel 61-1 as stored in framestore address (0) is output from framestore 75 to multiply accumulator 77, where that pixel code is multiplied by an associated weighting coefficient output by weighting coefficient memory 76.

As described previously, eight fractional bits of the pixel address code are employed to address one of a set ($2^8$=256 in the present example) of weighting coefficient look-up tables that contain respective sets of sixteen weighting coefficients each. The four MSBs of the fractional address component stored in START register 101 for each x and y address generator are coupled via link 97, together with the four bits of the starting address (of pixel 61-1) from address generator control unit 73 to form a twelve (12) bit address input to weighting coefficient memory 76. Therefore the weighting coefficient for the first pixel 61-1 as derived from a selected one of 256 LUTs as determined by the fractional bit location of pseudo pixel Pn is applied as an address input to memory 76. The accessed weighting coefficient is output from memory as a second input to multiply accumulator 77, wherein the actual value of the pixel code and the weighting coefficient associated with pixel 61-1 are multiplied together and retained for summation with the remaining fifteen pixels 61-2 . . . 61-16 of the first neighborhood.

Upon completion of the processing of the address of pixel 61-1, the x component of the address code (initially=x+yPPL) is sequentially incremented by single pixel increments in the x-direction of the stored image array, so as to generate respectively successive addresses for pixels 61-2, 61-3 and 61-4 of the first neighborhood. For this purpose, output multiplexer 83 is controlled to couple input 113 to its output, so that the value (+1) will be successively summed with the contents of multiply accumulator 74, so as to successively generate respective address codes (x+1+yPPL), (x+2+yPPL), (x+3+yPPL), for pixels 61-2, 61-3 and 61-4, respectively. Again, as each address code is incremented, its fractional component is employed to access a weighting coefficient from weighting coefficient memory 76. Each accessed weighting coefficient is multiplied by the pixel code value read out of the framestore 75 and the products are sequentially summed in multiply accumulator 77.

Upon the generation of the address code (x+3+yPPL) for pixel 61-4, the y component of the address code is incremented by a value of (+1) as supplied to input 113 of output multiplexer 83 in the y address generator 72. Incrementing the y value of the address code by +1 effectively increments the address code by a value corresponding to the number of pixels per line (PPL), since the y value is multiplied by the contents of the END register 102 in the x address generator. As a consequence, the fifth address code in the neighborhood sequence is the value (x+3+(y+1)PPL), which corresponds to the address of pixel 61-8.

The x component of the address code is then sequentially decremented by single pixel increments in the x-direction of the stored image array, by coupling the (−1) input 114 of output multiplexer 83 in x address generator 71 to the x address line input to multiply accumulator 74, so as to successively generate respective address codes (x+2+(y+1)PPL), (x+1+(y+1)PPL) and (x+(y+1)PPL), for pixels 61-7, 61-6 and 61-5, respectively. Following the generation of the address code (x+(y+1)PPL), for pixel 61-5, the y component of the address code is again incremented by a value corresponding to the number of pixels per line (PPL), using the (+1) input to output multiplexer 83 in the y address generator 72, as described above for pixel 61-8, so that the ninth address code in the neighborhood sequence is the value (x+(y+2)PPL), which corresponds to the address of pixel 61-9. The x component of the current address code (x+(y+2)PPL) is then again sequentially incremented by single pixel increments in the x-direction of the stored image array, so as to successively generate respective address codes (x+1+ (y+2)PPL), (x+2+(y+2)PPL), (x+3+(y+2)PPL), for pixels 61-10, 61-11 and 61-12, respectively.

Following the generation of the address code (x+3+(y+2)PPL) for pixel 61-12, the y component of the address code is once again incremented by (+1) to (y+3) thereby increasing the y address component by a value corresponding to the number of pixels per line (PPL), so that the thirteenth address code in the neighborhood sequence is the value (x+3+(y+3)PPL), which corresponds to the address of pixel 61-16. The x component of the address code is then sequentially decremented by single pixel increments in the x-direction of the stored image array, so as to successively generate respective address codes (x+2+(y+3)PPL), (x+1+ (y+3)PPL) and (x+(y+3)PPL), for pixels 61-15, 61-14 and 61-13, respectively, thus completing the generation of the address codes for the sixteen pixels of the neighborhood 53 about pseudo pixel Pn. The summation value now stored in multiply accumulator 77 corresponds to the estimate pixel code value for the first pseudo pixel Pn of the output image array, which may be stored in an output buffer for subsequent readout to a reproduction device.

After the first neighborhood 53 has been processed to derive an interpolated pixel output value for the first pseudo pixel Pn of the output image array, downcounter 103 in x address generator 71 is decremented by one count, associated with the completion of the processing of the first pixel in the first line of the output image array. The original address value of the first pixel in the first neighborhood is then incremented by a value associated with a first pixel in a similar neighborhood of (sixteen) pixels surrounding the next successive pseudo pixel Pn+dx within the first line of the output image.

For this purpose, the current contents of the START register 101 in the x address generator are summed in adder 87 with the 'dx' code stored in 'd' register 95, with the sum being written into START register 101, which now effectively functions as an accumulator, to enable the address generator to step through successive output pixels of the output image. The contents of START register 101 now point to the northwestmost input pixel in the neighborhood of sixteen surrounding the second pseudo pixel Pn+dx in the first line of the output image. The foregoing process for generating successive address codes for respective ones of the pixels within the first neighborhood of pixels is now carried out for pseudo pixel Pn+dx. As each successive neighborhood for the first line of pseudo pixels of the output image is processed downcounter 103 within x address generator 71 is decremented. The generation of address codes for successive neighborhoods continues as described above until down-counter 103 has been decremented to zero, whereupon the state of output line 107 changes state, indicating to address generator control unit 73 that the first line of pseudo pixels of the output image has been processed. This roll-over transition on line 107 is used to decrement down-counter 103 in y address generator, in association with the completion of the processing of a complete line of pseudo pixels (here the first line) of the output image.

To begin processing the second line of pseudo pixels of the output image, START register 101 in x address generator 71 is reloaded with the x address component of the first output pixel of the output image, that was initially loaded for processing the first pixel in the first line, to provide an x value for the address code expression (X,1+Y*PPL). The contents of the START register 101 in y address generator 72 is summed in adder 87 with the 'dy' contents of the 'd' register 95, to provide a Y value for the address code expression (X,1+Y*PPL), so as to complete the address of the first neighborhood pixel for the first pixel Pn+dy of the second line of the output image.

Namely, for the second line of pseudo pixels, the x,y START registers points to the x,y components of the address of the northwestmost pixel of a respective sixteen pixel neighborhood 53 surrounding the first pseudo pixel Pn+dy of the second line. As in the case of the first line of pseudo pixels, the contents of each of START and END registers are supplied, together with incremental unitary values (+1) and (−1) to respective inputs of 4:1 output multiplexer 83, to successively step through the sixteen addresses of the neighborhood surrounding pseudo pixel Pn+dy. As each address code is incremented, its fractional component is employed to access a weighting coefficient from weighting coefficient memory 76, wherein each accessed weighting coefficient is multiplied by the pixel code value read out of the framestore 75 and the products are sequentially summed in multiply accumulator 77. Upon completing the generation of the address codes for the sixteen pixels of the neighborhood about pseudo pixel Pn+dy, the summation value stored in multiply accumulator 77 corresponds to the estimate pixel code value for the first pseudo pixel Pn+dy of the second line of the output image array.

As each successive neighborhood for the second line of pseudo pixels of the output image is processed, downcounter 103 within x address generator 71 is decremented, as described above for the first line. The generation of address codes for successive neighborhoods continues, until x down-counter 103 has been decremented to zero, whereupon the state of output line 107 changes state, indicating to the address generator control unit 73 that the first line of pseudo pixels of the output image has been processed. This roll-over transition on line 107 again causes y down-counter 103 to be decremented, in association with the completion of the processing of a complete line of pseudo pixels (here the second line) of the output image.

The above process is sequentially repeated for each of the k lines of the output image until y down counter 103 has been decremented to zero, indicating completion of processing of the last or jth pixel of the last or kth line of pseudo pixels of the output image. Namely, for obtaining output pixel values associated with each of the pseudo of the output image, it is only necessary to successively increment the x and y components of the memory address of the first pixel (61-1) of the first neighborhood 53 and thereafter repeat the above described stepwise incremented scanning process across the first line of the output image, and then down successive lines of the output image, thereby providing successive interpolated pixel data values corresponding to each of the pseudo pixels of the j×k output image array.

WEIGHTING COEFFICIENT GENERATION

Figure 10:
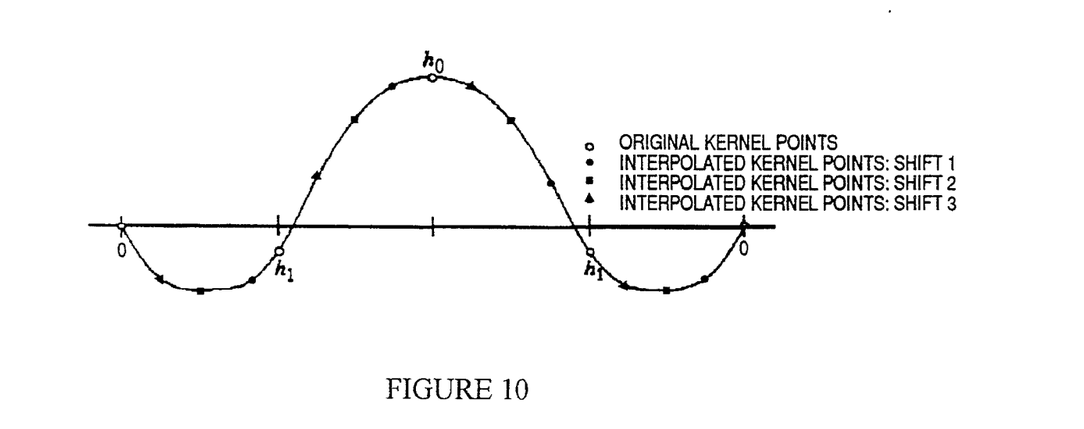
FIG. 10 shows an example of a kernel with a polynomial fit to four kernel points.
Figure 11:
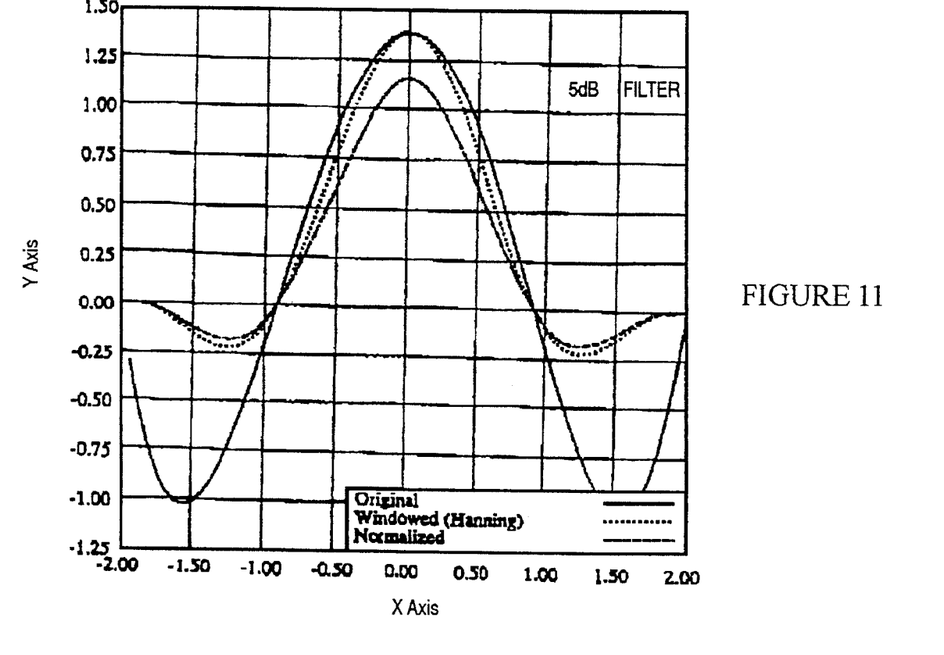
FIGS. 11 and 12 respectively show the characteristics of 3 dB and 5 dB filter functions.
Figure 12:
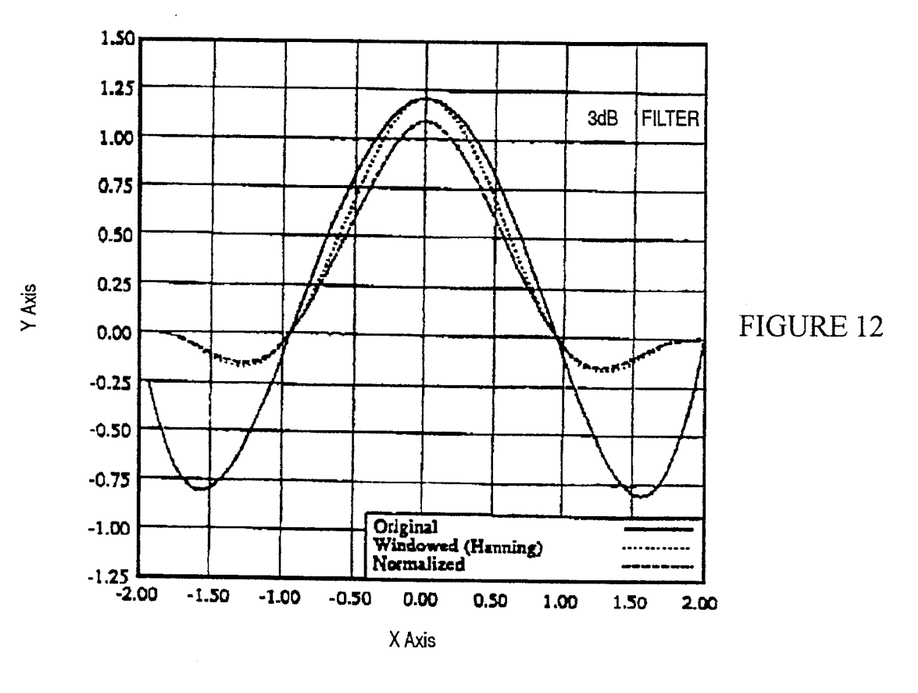

As pointed out above, the weighting coefficient operator employed to interpolate the value of a respective pseudo pixel may be derived in accordance with an edge sharpening filtering mechanism diagrammatically shown in FIGS. 10, 11 and 12, which has particular utility in connection with laser reproduction output devices. More specifically, laser printers typically require filter kernels for image resampling to the printer resolution. While some filters maintain fidelity during resampling with a flat frequency response, i.e. with no real filtering or image enhancement, it is desirable to employ a filter mechanism comprising a set of coefficients for increasing the modulation transfer function (MTF) and therefore provide some degree of edge sharpening during image resampling.

The weighting mechanism through which respective pseudo pixels are interpolated is a two dimensional (2-D) operator which, in the present example, is referenced to sixteen pixel data values in the original image per pseudo pixel. The filter kernel may be separable into two identical (although orthogonal) one dimensional (1-D) components, each 1-D filter being limited to four coefficients, so that the filter has a size 1×4. Cross multiplication of the filter coefficients yields a desired 2-D filter kernel. In order to provide high quality resampling, the filter kernel must be of higher resolution than the image of interest, so that points falling in between image pixels may be accurately interpolated (or resampled). To yield this high resolution filter, which can also be thought of as numerous shifted versions of the original resampling filter, the 1×4 filter kernel is interpolated at 15 subpixel intervals. This yields 16 total 1×4 filter kernels.

The filter kernel set for image enhancement begins with an unknown set of filter coefficients, which are transformed into the frequency domain; some constraints are applied to the filter's frequency response. It is desirable to pass the zero frequency component (DC) unchanged, but provide gain to the highest frequencies (since image edges are comprised of high spatial frequencies). By applying several constraints to the frequency response, a solution for the spatial domain coefficients can be obtained.

Typically, a high frequency boosts of 3 dB or lower cannot be seen by the human eye, and therefore high frequency gains in the 5–10 dB range may be appropriate for the edge enhancement required. Tests to determine necessary gain are carried out by trial and error by a set of observers. Small changes in gain are likely to be noticed by some observers but not by others. The gains specified for a 1-D filter are multiplied by themselves when the 1-D filter is used to create a 2-D filter. For example, a 5 dB gain at frequency $\pi$ in the 1-D filter becomes a 10 dB gain at frequency $(\pi,\pi)$ in 2-D (since gain multiplication is an addition in terms of decibels). Although the 1-D resampling filter may have four coefficients, it is desirable to construct a symmetric filter with one coefficient at the center. Therefore, a three coefficient filter is employed which is padded with a single zero valued coefficient. To obtain the high resolution filter coefficients. Namely, for those 15 additional coefficients falling between two adjacent coefficients from the set of four, a polynomial interpolation scheme is used. This interpolation tends to increase the high frequency gain of the filter, and therefore a window is applied to the spatial domain filter (and interpolated versions of the filter). Normalization is then performed to ensure that the constraint placed on the DC response of the filter is still met after interpolation and windowing. Details of the filter design including coefficient selection, interpolation, windowing, and normalization are discussed below.

Coefficient Selection

The desired 1-D filter kernel is of the form $[h_1 \; h_0 \; h_1 \; 0]$ where $h_0$ is the center of the filter, and is symmetric, since it desirable to treat light to dark image edges no differently than dark to light edges; (in addition, this ensures that the frequency response of the filter is real). The frequency response of the filter is given by its Fourier transform $$H(\omega) = h_0 + h_1 e^{-j\omega} + h_1 e^{j\omega}$$
$$= h_0 + h_1 [e^{-j\omega} + e^{j\omega}]$$

Using the identity $\cos.\omega = \frac{1}{2}[e^{j\omega} + e^{-j\omega}]$, the frequency response of the filter becomes $$H(\omega) = h_0 + 2h_1 \cos.\omega$$

To perform high pass filtering without affecting the gain at DC, the gain is set equal to 1 at $.\omega=0$ and to some gain $k>1$ at $.\omega=\pi$. Applying these two constraints to the frequency response above the following two equations are obtained.

$$H(0)=1=h_0+2h_1$$

$$H(1)=k=h_0-2h_1$$

Solving these two equations for the two unknowns, $h_0$ and $h_1$, yields $$h_0=(k+1)/2 \quad h_1=(1-k)/4$$

which determine the filter coefficients for a high frequency gain k. Typically, the gain may be specified in decibels (dB). In this case, gain G is given by $G=20 \log k$. Therefore, given a gain G, k is calculated using $k=10^{G/20}$ and substituted into the above equations to determine the two unique filter coefficients $h_0$ and $h_1$.

Interpolation

The above filter coefficients specify a ¼ kernel $[h_1 \; h_0 \; h_1 \; 0]$ for edge sharpening when the pseudo pixels of the output image array are exactly aligned with the input pixels of the input image. Usually, however, output or pseudo pixel locations correspond to locations other than the input pixel centers (which are on a regular rectangular grid, as diagrammatically illustrated in FIG. 6). Namely, as described above, if the output image is of a different resolution (or rotation) than the input image, output pixel locations will fall between locations of the input pixel centers. Although the value of the nearest neighbor pixel in the input space could be used to determine the values of these output pixels, such a technique destroys the sharpness of image edges.

To retain image fidelity, interpolation of the output pixel value from a set of neighboring pixels in the input space is performed. By performing this interpolation for all points in an output image, the input image is said to be "resampled". Only when a single input image pixel corresponds to a single output printer pixel would no resampling be required. The 1×4 edge sharpening filter described above could then be used as-is. To accommodate accurate image resampling using the 1×4 edge sharpening kernel, filter values between the four coefficients described above must be determined. For this purpose, a function must be fit to the four points, and values between the points are interpolated using this function.

FIG. 10 shows an example of a kernel with a polynomial fit to the four kernel points (as well as a limiting zero on the left hand side to make the function symmetric). The original filter coefficients are indicated by the hollow circles. Interpolated values for three sub-pixel shifts of the filter (from right to left) are indicated by the other symbols. Interpolated values are provided by the Numerical Recipes polynomial interpolation routine "polint", which interpolates the points using Neville's algorithm as described in the text: "Numerical Recipes in C," by W.H. Press et al, Cambridge University Press, Chapter 3, 1988. For the sake of clarity, only three sub-pixel shifts are shown in the FIG. 10, although, in practice, fifteen sub-pixel shifts of the filter kernel are necessary (for a total of 16 1×4 kernels). Since five points on the polynomial are specified, a polynomial of degree four is chosen as the curve to fit to the four original kernel point.

Windowing

In the course of implementing a filter meeting the above constraints and interpolated as discussed previously, it was found that the filter overemphasized the high spatial frequencies present in the image. The reason for this was that although the value $h_1$ was designed to set the high frequency gain of the filter, when the sub-pixel filter values were interpolated between $h_1$ and zero, many of the values were more negative than $h_1$ (as evidenced in FIG. 10). This results in a higher gain than predicted, simply due to the curve fit through the original kernel points for interpolation.

To suppress the effect of the negative dips in the filter function (or the "sidelobes"), a window is applied to the original and all sub-pixel interpolated values of the kernel. The window applied is the commonly used Hanning window given by the equation:

$$w(x)=\frac{1}{2}[1-\cos[2\pi(x+2)/(4)]]$$

which has a value of one at the center $x=0$ (i.e. where the filter is equal to $h_0$), and zero at the ends $x=-2$ and $x=2$ (where the filter is equal to zero). This window effectively retains the high-pass filtering behavior of the filter, but suppresses the large negative dips (which increase the high pass gain) due to polynomial interpolation.

Normalization

The constraint $H(0)=1=h_0+2h_1$ ensures that the zero frequency or DC response of the filter is unity. This constraint, however, applies only the solution for $h_0$ and $h_1$. This constraint does not apply to interpolated filter kernel values or to the kernel values after application of the Hanning window. In order to ensure that the DC response has a value of one for these cases, the filter coefficients determined by design, interpolation and windowing are normalized.

As shown in the FIG. 10, the filter coefficients for each sub-pixel shift of the filter are determined via interpolation. For each shift, four coefficient values are determined. Each set of four coefficient values is then normalized by dividing each coefficient by the sum of the four coefficients.

In order to provide the needed MTF emphasis to the imagery printed using a laser printer, a 5 dB gain was selected as a design value of G, to provide sufficient edge sharpening. Using the equations above for filter selection with this gain yielded values of $h_0=1.389$ and $h_1=-0.195$. The solid line curve in FIG. 11 shows zero padding of these coefficients and polynomial interpolation of fifteen sub-pixel shifts of this initial set of coefficients. Application of a Hanning window to suppress the large sidelobes present in this curve results in coefficients falling on the dotted line in FIG. 11. Normalization of each set of four coefficients then yields points on the dashed line. Substituting the windowed and normalized coefficients into the gain equations above yields the resultant gain of the filter to be used. In the illustrated example, the gain is G=2.44 dB. Similar results obtained for a filter designed for G=3 dB are shown in FIG. 12. In this case, the resultant gain obtained after windowing and normalization was G=1.49 dB. A design gain of 5 dB yielded a resultant gain of 2.44 dB for the one dimensional filter, which becomes a gain of 4.88 dB at a frequency $(\pi,\pi)$ in two dimensions.

As will be appreciated from the foregoing description, the present invention effectively overcomes drawbacks such as bit 'stuffing' and memory management schemes required by conventional address preallocation image mapping systems by means a pixels per line and lines per image-based framestore address generation mechanism, through which imagery data associated with respective pixels of a two-dimensional spatial image array are written into and read out of consecutively contiguous storage locations of memory, thereby obviating the need for dummy memory locations in which 'fill' data would otherwise be inserted to effect a spatial mapping of memory space to the pixels of the image array.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A method of generating data values respectively associated with output pixels of a j line by k output pixels per line output image array, based upon the contents of a stored image data base, the contents of said stored image data base being associated with respective pixels of an m line by n input pixels per line input image array, respectively successive m lines of pixel code values of which are stored, on a line by line basis, in m successively contiguous segments of addressable memory locations of said data base, each segment containing n successive addresses, said method comprising the steps of:

(a) for a first output pixel within a first line of said output image array, irrespective of whether or not said first output pixel coincides with an input pixel, sequentially generating respective address signals for a plurality of storage locations of said data base associated with a first neighborhood of input pixels surrounding said first output pixel, and thereby accessing input pixel data values stored in said plurality of storage locations, and processing the accessed input pixel data values to derive an output pixel data value associated with said first output pixel; and (b) for each remaining (k−1) output pixel within said first line and the k pixels in each remaining second through jth line of said output image array, irrespective of whether or not the remaining output pixels coincide with input pixels, sequentially generating respective address signals for a respective plurality of storage locations of said data base associated with a neighborhood of input pixels surrounding said each remaining output pixel, and thereby accessing input pixel data values stored in said respective plurality of storage locations, and processing the accessed input pixel data values to derive an output pixel data value associated with said each remaining output pixel.

2. A method according to claim 1, wherein step (a) comprises generating a memory address of the pixel data value of said first input pixel within said first neighborhood of input pixels surrounding said first output pixel and accessing the contents of the storage location of said memory associated with said first input pixel, so as to read out a first pixel data value from said associated selected storage location of said memory, by generating its memory address as a combination of a first address code representative of where, within the line of pixels containing said first pixel, said first pixel is located, and a second address code representative of the product of the number of pixels per line and a value representative of said line of pixels, and thereafter successively generating memory addresses of remaining ones of pixel data values of input pixels within said first neighborhood of input pixels surrounding said first output pixel and accessing the contents of the storage locations of said memory associated with the remaining pixels of said first neighborhood of input pixels, so as to read out a plurality of pixel data values from associated storage locations of said memory, by generating memory addresses for the remaining pixels of said first neighborhood as sequentially modified combinations of said first address code and said second address code.

3. A method according to claim 2, wherein step (b) comprises generating memory addresses of pixel data values of input pixels within respective ones of the remaining neighborhoods of input pixels surrounding remaining ones of the output pixels of said output image array and accessing the contents of the storage locations of said memory associated with the said remaining neighborhoods of input pixels, so as to read out pixel data values from their associated storage locations of said memory, by generating said memory addresses as combinations of said first address code and said second address code, sequentially modified in accordance with values representative of the spatial resolution of said output image array.

4. A method according to claim 3, wherein each of steps (a) and (b) of generating memory addresses of pixel data values of input pixels, within a respective one of the neighborhoods of input pixels surrounding the output pixels of said output image array, comprises generating respective address signals for a plurality of storage locations of said memory associated with a stepwise incremented pattern of a plurality of pixels surrounding a respective output pixel.

5. A method according to claim 1, wherein in each of steps (a) and (b), the step of processing the accessed input pixel data values to derive an output pixel data value associated with output pixels of the output image array comprises selectively weighting and combining the accessed pixel data values of a respective neighborhood of input pixels to provide a respective interpolated estimate of a respective output pixel.

6. A mechanism for interfacing data representative of respective pixel values of an image with a memory, said image being comprised of m successive lines of pixels, each line being comprised of n pixels, said memory having a plurality of storage locations that are individually addressable for writing pixel data values into and reading pixel data values from said memory, comprising:

a data input unit for writing data values associated with successive pixels of a first line of said image into successive first through n storage locations of said memory and writing data values associated with successive pixels of successive ones of second through m lines of said image into successive (n+1) through m×n storage locations of said memory, irrespective of whether the number of pixels of said image is the same as or less than the number of said plurality of storage locations of said memory; and a data output unit for generating output pixel data values associated with a plurality of spatial locations within a selected portion of said image, irrespective of whether or not said selected spatial locations coincide with pixels, said data output unit being operative to access pixel code values stored in respective pluralities of memory storage locations associated with respective pluralities of pixels surrounding respective ones of said plurality of spatial locations and processing respective pluralities of pixel code values accessed to derive said plurality of output pixel data values.

7. A mechanism according to claim 6, wherein said data output unit is operative to generate output pixel data values associated with said plurality of spatial locations within a selected portion of said image, irrespective of whether or not the spatial separation between adjacent ones of said selected spatial locations corresponds to the spatial separation between adjacent ones of said pixels.

8. A mechanism according to claim 7, wherein said data output unit is operative to perform the process of identifying a first pixel within a plurality of pixels surrounding a respective selected spatial location and accessing the contents of the storage location of said memory associated with said first pixel, so as to read out a pixel data value from said associated selected storage location of said memory, said data output unit generating its memory address as a combination of a first address code representative of where, within the line of pixels containing said first pixel, said first pixel is located, and a second address code representative of the product of the number of pixels per line and a value representative of said line of pixels, and wherein said data output unit is further operative to repeat said process for each of the remaining pixels of the plurality of pixels surrounding said respective selected spatial location.

9. An apparatus for generating data values respectively associated with output pixels of a j line by k output pixels per line output image array, based upon the contents of a stored image data base, the contents of said stored image data base being associated with respective pixels of an m line by n input pixels per line input image array, respectively successive m lines of pixel code values of which are stored, on a line by line basis, in m successively contiguous segments of addressable memory locations of said data base, each segment containing n successive addresses, said apparatus comprising:

an address generator which, for a first output pixel within a first line of said output image array and irrespective of whether or not said first output pixel coincides with an input pixel, is operative to sequentially generate respective address signals for a plurality of storage locations of said data base associated with a first neighborhood of input pixels surrounding said first output pixel, and thereby access input pixel data values stored in said plurality of storage locations, and, for each remaining (k−1) output pixel within said first line and the k pixels in each remaining second through jth line of said output image array, irrespective of whether or not the remaining output pixels coincide with input pixels, is operative to sequentially generate respective address signals for a respective plurality of storage locations of said data base associated with a neighborhood of input pixels surrounding said each remaining output pixel, and thereby access input pixel data values stored in said respective plurality of storage locations, and a data processing unit which processes the accessed input pixel data values to derive output pixel data values associated with said each output pixel.

10. An apparatus according to claim 9, wherein said address generator is operative to generate a memory address of the pixel data value of said first input pixel within said first neighborhood of input pixels surrounding said first output pixel and to access the contents of the storage location of said memory associated with said first input pixel, so as to read out a first pixel data value from said associated selected storage location of said memory, said address generator generating a memory address as a combination of a first address code representative of where, within the line of pixels containing said first pixel, said first pixel is located, and a second address code representative of the product of the number of pixels per line and a value representative of said line of pixels, and thereafter successively generating memory addresses of remaining ones of pixel data values of input pixels within said first neighborhood of input pixels surrounding said first output pixel and accessing the contents of the storage locations of said memory associated with the remaining pixels of said first neighborhood of input pixels, so as to read out a plurality of pixel data values from associated storage locations of said memory, by generating memory addresses for the remaining pixels of said first neighborhood as sequentially modified combinations of said first address code and said second address code.

11. An apparatus according to claim 10, wherein said address generator is operative to generate memory addresses of pixel data values of input pixels within respective ones of the remaining neighborhoods of input pixels surrounding remaining ones of the output pixels of said output image array and to access the contents of the storage locations of said memory associated with the said remaining neighborhoods of input pixels, so as to read out pixel data values from their associated storage locations of said memory, by generating said memory addresses as combinations of said first address code and said second address code, sequentially modified in accordance with values representative of the spatial resolution of said output image array.

12. An apparatus according to claim 11, wherein said address generator is operative to generate memory addresses of pixel data values of input pixels, within a respective one of the neighborhoods of input pixels surrounding the output pixels of said output image array, by generating respective address signals for a plurality of storage locations of said memory associated with a stepwise incremented pattern of a plurality of pixels surrounding a respective output pixel.

13. An apparatus according to claim 9, wherein said data processing unit is operative to process the accessed input pixel data values to derive an output pixel data value associated with output pixels of the output image array by selectively weighting and combining the accessed pixel data values of a respective neighborhood of input pixels to provide a respective interpolated estimate of a respective output pixel.

14. A method of generating data values respectively associated with output pixels of an output image array having a spatial resolution of j lines by k output pixels per line, based upon the contents of an input image having a spatial resolution of m lines by n input pixels per line, respectively successive m lines of pixel code values of which are stored, on a line by line basis, in m successively contiguous segments of addressable memory locations of a data base, each segment containing n successive addresses, said method comprising the steps of:

(a) for each respective output pixel of said output image, accessing a plurality of pixel code values respectively associated with a respective neighborhood of input pixels surrounding said respective output pixel; and (b) processing the pluralities of pixel code values accessed in step (a) to derive respective output pixel code values associated with the j×k pixels of said output image array; and wherein the separation between adjacent pixels of a respective one of the j lines of pixels of said output image array is defined in accordance with a first prescribed relationship between the number of pixels per line of said output image array and the number of pixels per line of said input image array, and the separation between adjacent ones of the j lines of pixels of said output image array is defined in accordance with a second prescribed relationship between the j lines of pixels of said output image array and the m lines of pixels of said input image array, such that each neighborhood of input pixels code values processed in step (b) to derive an output pixel code value has the same spatial size and is associated with only input pixels of said input image array.

15. A method according to claim 14, wherein said first prescribed relationship establishes the separation between adjacent pixels of a respective one of the j lines of pixels of said output image array in accordance with the ratio of the difference between the k pixels per line of said output image array minus a first predetermined number of pixels and the n pixels per line of said input image array, and wherein said second prescribed relationship establishes the separation between adjacent lines of said output image array in accordance with the ratio of the difference between the j lines of said output image array minus a second predetermined number and the m lines of said input image array.

16. A method according to claim 14, wherein step (a) comprises (a1) sequentially generating respective address signals for a plurality of storage locations of said data base associated with a first neighborhood of input pixels surrounding said first output pixel, and thereby accessing input pixel data values stored in said plurality of storage locations, and (a2) for each remaining (k−1) output pixel within said first line and the k pixels in each remaining second through jth line of said output image array, sequentially generating respective address signals for a respective plurality of storage locations of said data base associated with a neighborhood of input pixels surrounding said each remaining output pixel, and thereby accessing input pixel data values stored in said respective plurality of storage locations.

17. A method according to claim 16, wherein step (a1) comprises generating a memory address of the pixel data value of said first input pixel within said first neighborhood of input pixels surrounding said first output pixel and accessing the contents of the storage location of said memory associated with said first input pixel, so as to read out a first pixel data value from said associated selected storage location of said memory, by generating its memory address as a combination of a first address code representative of where, within the line of pixels containing said first pixel, said first pixel is located, and a second address code representative of the product of the number of pixels per line and a value representative of said line of pixels, and thereafter successively generating memory addresses of remaining ones of pixel data values of input pixels within said first neighborhood of input pixels surrounding said first output pixel and accessing the contents of the storage locations of said memory associated with the remaining pixels of said first neighborhood of input pixels, so as to read out a plurality of pixel data values from associated storage locations of said memory, by generating memory addresses for the remaining pixels of said first neighborhood as sequentially modified combinations of said first address code and said second address code.

18. A method according to claim 17, wherein step (a2) comprises generating memory addresses of pixel data values of input pixels within respective ones of the remaining neighborhoods of input pixels surrounding remaining ones of the output pixels of said output image array and accessing the contents of the storage locations of said memory associated with the said remaining neighborhoods of input pixels, so as to read out pixel data values from their associated storage locations of said memory, by generating said memory addresses as combinations of said first address code and said second address code, sequentially modified in accordance with values representative of the spatial resolution of said output image array.

19. A method according to claim 14, wherein step (b) of processing accessed input pixel data values to derive an output pixel data value associated with output pixels of the output image array comprises selectively weighting and combining the accessed pixel data values of a respective neighborhood of input pixels to provide a respective interpolated estimate of a respective output pixel.

20. A method of interfacing data representative of respective pixel values of an image with a memory, said image being comprised of successive lines of pixels, each line having a prescribed number of pixels, said memory having a plurality of storage locations that are individually addressable for writing pixel data values into and reading pixel data values from said memory, said method comprising the steps of:

irrespective of whether the number of pixels of said image is the same as or less than the number of said plurality of storage locations of said memory, (a) writing data values associated with successive pixels of a respective ith line of said image into first successive storage locations of said memory;

(b) writing data values associated with successive pixels of a respective (i+1)th line of said image into second successive storage locations of said memory that immediately follow said first successive storage locations; and (c) reading out pixel data values from said memory by generating address signals for accessing the contents of selected storage locations of said memory by
  (c1) identifying a selected spatial location within said image irrespective of whether or not said selected spatial location coincides with a pixel,
  (c2) sequentially generating respective address signals for a plurality of storage locations of said memory associated with a plurality of pixels surrounding said selected spatial location, and thereby accessing pixel data values stored in said plurality of storage locations, and
  (c3) processing the pixel data values accessed in step (c2) to derive a pixel data value associated with said selected spatial location, and wherein
  step (c2) comprises
  (c2-1) identifying a first pixel within said plurality of pixels surrounding said selected spatial location and accessing the contents of the storage location of said memory associated with said first pixel, so as to read out a pixel data value from said associated selected storage location of said memory, by generating its memory address as a combination of a first address code representative of where, within the line of pixels containing said first pixel, said first pixel is located, and a second address code representative of the product of the number of pixels per line and a value representative of said line of pixels, and
  (c2-2) repeating step (c2-1) for each of the remaining pixels of said plurality of pixels surrounding said selected spatial location.

21. A method of interfacing data representative of respective pixel values of an image with a memory, said image being comprised of successive lines of pixels, each line having a prescribed number of pixels, said memory having a plurality of storage locations that are individually addressable for writing pixel data values into and reading pixel data values from said memory, said method comprising the steps of:

irrespective of whether the number of pixels of said image is the same as or less than the number of said plurality of storage locations of said memory, (a) writing data values associated with successive pixels of a respective ith line of said image into first successive storage locations of said memory;

(b) writing data values associated with successive pixels of a respective (i+1)th line of said image into second successive storage locations of said memory that immediately follow said first successive storage locations; and (c) reading out pixel data values from said memory by generating address signals for accessing the contents of selected storage locations of said memory by
  (c1) identifying a selected spatial location within said image irrespective of whether or not said selected spatial location coincides with a pixel,
  (c2) sequentially generating respective address signals for a plurality of storage locations of said memory associated with a plurality of pixels surrounding said selected spatial location, and thereby accessing pixel data values stored in said plurality of storage locations, and
  (c3) processing the pixel data values accessed in step (c2) to derive a pixel data value associated with said selected spatial location, and wherein
  step (c2) comprises generating respective address signals for a plurality of storage locations of said memory associated with a stepwise incremented pattern of a plurality of pixels surrounding said selected spatial location, and thereby accessing pixel data values stored in said plurality of storage locations.

22. A method according to claim 21, wherein step (c2) comprises
  (c2-1) identifying a first pixel within said plurality of pixels surrounding said selected spatial location and accessing the contents of the storage location of said memory associated with said first pixel, so as to read out a pixel data value from said associated selected storage location of said memory, by generating its memory address as a combination of a first address code representative of where, within the line of pixels containing said first pixel, said first pixel is located, and a second address code representative of the product of the number of pixels per line and a value representative of said line of pixels, and
  (c2-2) repeating step (c2-1) for each of the remaining pixels of said stepwise incremented of said plurality of pixels surrounding said selected spatial location by sequentially modifying said memory address by code values that cause said memory address to take on values associated with successive pixels along said stepwise incremented pattern.

23. A method of interfacing data representative of respective pixel values of an image with a memory, said image being comprised of successive lines of pixels, each line having a prescribed number of pixels, said memory having a plurality of storage locations that are individually addressable for writing pixel data values into and reading pixel data values from said memory, said method comprising the steps of:

irrespective of whether the number of pixels of said image is the same as or less than the number of said plurality of storage locations of said memory, (a) writing data values associated with successive pixels of a respective ith line of said image into first successive storage locations of said memory;

(b) writing data values associated with successive pixels of a respective (i+1)th line of said image into second successive storage locations of said memory that immediately follow said first successive storage locations; and (c) identifying a selected pixel within said image and accessing the contents of its associated storage location of said memory so as to read out a pixel data value from said associated storage location of said memory, by generating a memory address as a combination of a first address code representative of where, within the line of pixels containing said selected pixel, said selected pixel is located, and a second address code representative of the product of the number of pixels per line and a value representative of said line of pixels, wherein
  step (c) further includes the steps of
  (c1) identifying a further spatial location within said image irrespective of whether or not said selected spatial location coincides with a pixel,
  (c2) sequentially generating respective address signals for a plurality of storage locations of said memory associated with a plurality of pixels surrounding said further spatial location, and thereby accessing pixel data values stored in said plurality of storage locations, and (c3) processing the pixel data values accessed in step (c2) to derive a pixel data value associated with said further spatial location, and wherein step (c2) comprises (c2-1) identifying a first pixel within said plurality of pixels surrounding said further spatial location and accessing the contents of the storage location of said memory associated with said first pixel within said plurality of pixels surrounding said further spatial location, so as to read out a pixel data value from said associated selected storage location of said memory, by generating its memory address as a combination of a first address code representative of where, within the line of pixels containing said first pixel surrounding said further spatial location, said first pixel within said plurality of pixels surrounding said further spatial location is located, and a second address code representative of the product of the number of pixels per line and a value representative of said line of pixels, and (c2-2) repeating step (c2-1) for each of the remaining pixels of said plurality of pixels surrounding said further spatial location by sequentially modifying said memory address by code values that cause said memory address to take on values associated with pixels of said plurality of pixels.

24. A method of interfacing data representative of respective pixel values of an image with a memory, said image being comprised of m successive lines of pixels, each line being comprised of n pixels, said memory having a plurality of storage locations that are individually addressable for writing pixel data values into and reading pixel data values from said memory, said method comprising the steps of:

irrespective of whether the number of pixels of said image is the same as or less than the number of said plurality of storage locations of said memory;

(a) writing data values associated with successive pixels of a first line of said image into successive first through n storage locations of said memory and writing data values associated with successive pixels of successive ones of second through m lines of said image into successive (n+1) through m×n storage locations of said memory; and (b) generating output pixel data values associated with a plurality of spatial locations within a selected portion of said image, irrespective of whether or not said selected spatial locations coincide with pixels, by accessing pixel code values stored in respective pluralities of memory storage locations associated with respective pluralities of pixels surrounding respective ones of said plurality of spatial locations and processing respective pluralities of pixel code values accessed to derive said plurality of output pixel data values, and wherein step (b) further comprises (b1) identifying a first pixel within a plurality of pixels surrounding a respective selected spatial location and accessing the contents of the storage location of said memory associated with said first pixel, so as to read out a pixel data value from said associated selected storage location of said memory, by generating its memory address as a combination of a first address code representative of where, within the line of pixels containing said first pixel, said first pixel is located, and a second address code representative of the product of the number of pixels per line and a value representative of said line of pixels, and (b2) repeating step (b1) for each of the remaining pixels of the plurality of pixels surrounding said respective selected spatial location.

* * * * *